(12) United States Patent
Chen et al.

(10) Patent No.: US 11,387,204 B2
(45) Date of Patent: Jul. 12, 2022

(54) SEMICONDUCTOR STRUCTURE AND METHOD OF FABRICATING THE SAME

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/745,295

(22) Filed: Jan. 16, 2020

(65) Prior Publication Data
US 2021/0225790 A1    Jul. 22, 2021

(51) Int. Cl.
*H01L 23/36* (2006.01)
*H01L 23/00* (2006.01)
(Continued)

(52) U.S. Cl.
CPC .......... *H01L 24/06* (2013.01); *H01L 23/3107* (2013.01); *H01L 23/367* (2013.01); *H01L 23/528* (2013.01); *H01L 23/5226* (2013.01); *H01L 24/03* (2013.01); *H01L 24/05* (2013.01); *H01L 24/08* (2013.01); *H01L 24/27* (2013.01); *H01L 24/29* (2013.01); *H01L 24/32* (2013.01); *H01L 24/83* (2013.01); *H01L 25/0657* (2013.01); *H01L 25/50* (2013.01); *H01L 24/13* (2013.01); *H01L 24/73* (2013.01); *H01L 2224/0401* (2013.01); *H01L 2224/05025* (2013.01); *H01L 2224/06519* (2013.01); *H01L 2224/08147* (2013.01); *H01L 2224/13023* (2013.01); *H01L 2224/32145* (2013.01); *H01L 2224/73253* (2013.01); *H01L 2224/80895* (2013.01); *H01L 2224/80896* (2013.01); *H01L 2224/83895* (2013.01); *H01L 2224/83896* (2013.01); *H01L 2225/06541* (2013.01); *H01L 2225/06565* (2013.01)

(58) Field of Classification Search
CPC ..... H01L 25/0657; H01L 25/50; H01L 24/80; H01L 2225/06541
See application file for complete search history.

(56) References Cited

U.S. PATENT DOCUMENTS 6,424,051 B1 * 7/2002 Shinogi .............. H01L 23/3185
257/758
8,314,483 B2 * 11/2012 Lin .................... H01L 24/80
257/686
(Continued)

*Primary Examiner* — Bradley Smith
*Assistant Examiner* — David J Goodwin
(74) *Attorney, Agent, or Firm* — JCIPRNET

(57) ABSTRACT

A semiconductor structure including a semiconductor substrate, an interconnect structure disposed over the semiconductor substrate, and a bonding structure disposed over the interconnect structure is provided. The bonding structure includes a dielectric layer covering the interconnect structure, signal transmission features penetrating through the dielectric layer, and a thermal conductive feature penetrating through the dielectric layer. The thermal conductive feature includes a thermal routing and thermal pads, and the thermal pads are disposed on and share the thermal routing.

20 Claims, 15 Drawing Sheets

(51) Int. Cl.
  *H01L 23/522* (2006.01)
  *H01L 25/065* (2006.01)
  *H01L 23/31* (2006.01)
  *H01L 23/367* (2006.01)
  *H01L 25/00* (2006.01)
  *H01L 23/528* (2006.01)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2009/0004777 A1* | 1/2009 | Kolan ............... H01L 25/0657 438/109 |
| 2010/0187670 A1* | 7/2010 | Lin ................... H01L 23/3677 257/686 |
| 2019/0157333 A1* | 5/2019 | Tsai ................... H01L 23/528 |
| 2019/0164914 A1* | 5/2019 | Hu .................... H01L 23/585 |

* cited by examiner

SEMICONDUCTOR STRUCTURE AND METHOD OF FABRICATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
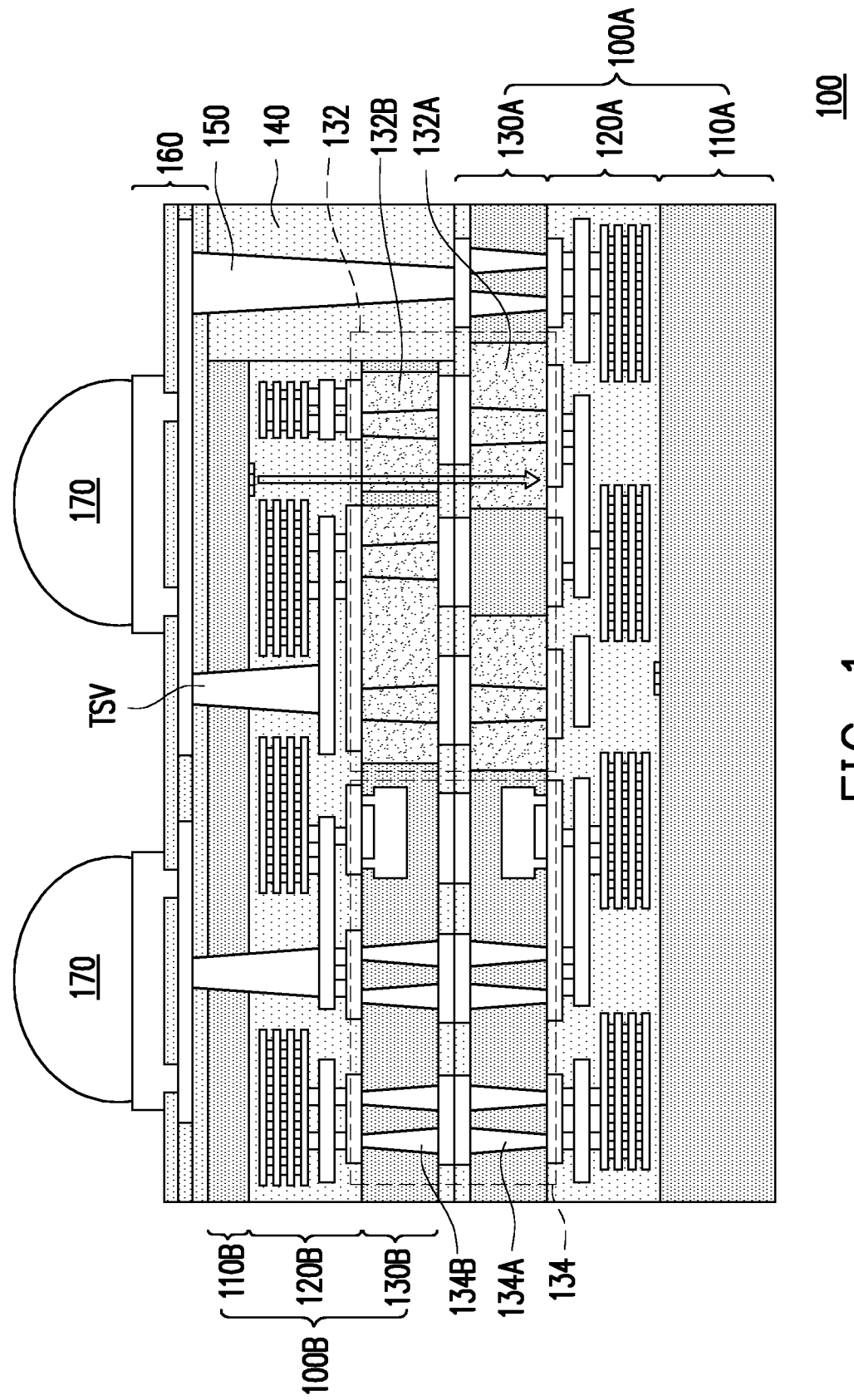
FIG. 1 is a cross-sectional view illustrating a system on integrated circuit (SoIC) chip in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a cross-sectional view illustrating a system on integrated circuit (SoIC) chip 100 in accordance with some embodiments of the present disclosure. Referring to FIG. 1, the SoIC chip 100 includes a first semiconductor die 100A and a second semiconductor die 100B stacked over and bonded with the first semiconductor die 100A. The first semiconductor die 100A may include a first semiconductor substrate 110A, a first interconnect structure 120A disposed over the first semiconductor substrate 110A, and a first bonding structure 130A disposed over the first interconnect structure 120A. In other words, the first interconnect structure 120A is disposed between the first semiconductor substrate 110A and the first bonding structure 130A. Furthermore, the first bonding structure 130A may include at least one first thermal conductive feature 132A and a plurality of first signal transmission features 134A. The second semiconductor die 100B may include a second semiconductor substrate 110B, a second interconnect structure 120B disposed over the second semiconductor substrate 110B, and a second bonding structure 130B disposed over the second interconnect structure 120B. In other words, the second interconnect structure 120B is disposed between the second semiconductor substrate 110B and the second bonding structure 130B. Furthermore, the second bonding structure 130B may include at least one second thermal conductive feature 132B and a plurality of second signal transmission features 134B.

As illustrated in FIG. 1, the second semiconductor die 100B is flipped over and bonded with the first semiconductor die 100A such that the first bonding structure 130A of the first semiconductor die 100A and the second bonding structure 130B of the second semiconductor die 100B are in contact with and bonded to each other. The first bonding structure 130A and the second bonding structure 130B are located between the first interconnect structure 120A and the second interconnect structure 120B. In some embodiments, hybrid bonding interface including dielectric-to-dielectric bonding interface and metal-to-metal bonding interface is formed between the first bonding structure 130A and the second bonding structure 130B. Furthermore, as illustrated in FIG. 1, the die size of the second semiconductor die 100B may be smaller than that of the first semiconductor die 100A such that a portion of the first bonding structure 130A is uncovered by the second semiconductor die 100B.

The at least one first thermal conductive feature 132A in the first bonding structure 130A may be in contact with and thermally coupled to the at least one second thermal conductive feature 132B in the second bonding structure 130B such that heat transfer performance of a dummy region 132 in the SoIC chip 100 may be enhanced. Since the first thermal conductive feature 132A and the second thermal conductive feature 132B in the second bonding structure 130B are made by materials having high thermal conductivity (k) such as metallic materials having high thermal conductivity, heat transfer performance of a dummy region 132 in the SoIC chip 100 may be improved significantly. In some embodiments, the material of the first thermal conductive feature 132A and the second thermal conductive feature 132B includes copper or the like, while the material of the dielectric material in the first bonding structure 130A and the second bonding structure 130B includes silicon oxide (e.g., TEOS formed oxide), silicon nitride, silicon oxynitride, or the like. In some embodiments, the first thermal conductive feature 132A and the second thermal conductive feature 132B include barrier layers, such as Ta/TaN composited layer. In some embodiments, the thermal conductivity (k) of the first thermal conductive feature 132A and the second thermal conductive feature 132B ranges from about 0.575 $Wm^{-1}K^{-1}$ to about 4.01 $Wm^{-1}K^{-1}$, while the thermal conductivity (k) of dielectric material in the first bonding structure 130A and the second bonding structure 130B ranges from about 0.01 $Wm^{-1}K^{-1}$ to about 0.1 $Wm^{-1}K^{-1}$.

In some embodiments, a layout area of the first thermal conductive feature 132A is greater than that of the first signal transmission features 134A, while a layout area of the second thermal conductive feature 132B is greater than that of the second signal transmission features 134B. For example, the layout area of the first thermal conductive feature 132A or the layout are of the second thermal conductive feature 132B is about 0.4% to about 0.6% of the whole area of the SoIC chip 100, while the layout area of the first signal transmission features 134A or the layout area of the second signal transmission features 134B is about 1% to about 30% of the whole area of the SoIC chip 100.

The first signal transmission features 134A may be in contact with and electrically connected to the second signal transmission features 134B such that signal transmission between the first semiconductor die 100A and the second semiconductor die 100B may achieved by a signal transmission region 134 in the SoIC chip 100. The first thermal conductive feature 132A and the second thermal conductive feature 132B distributed in the dummy region 132 are electrically insulated from the first signal transmission features 134A and the second signal transmission features 134B distributed in the signal transmission region 134. For example, the first thermal conductive feature 132A and the second thermal conductive feature 132B are electrical floating.

In some embodiments, the SoIC chip 100 may further include an insulating encapsulant 140 laterally encapsulating the second semiconductor die 100B, a through insulator via (TIV) 150 penetrating through the insulating encapsulant 140 and electrically connected to the first semiconductor die 100A, a redistribution circuit layer 160 disposed over the second semiconductor die 100B and the insulating encapsulant 140, and electrical terminals 170 disposed over and electrically connected to the redistribution circuit layer 160. The insulating encapsulant 140 and the TIV 150 may be disposed to cover the portion of the first bonding structure 130A uncovered by the second semiconductor die 100B, and the TIV 150 may be electrically connected to the first bonding structure 130A of the first semiconductor die 100A. In some embodiments, the insulating encapsulant 140 may be disposed aside the second semiconductor die 100B and encapsulate at least one sidewall of the second semiconductor die 100B. In some alternative embodiments, the insulating encapsulant 140 may surround and laterally encapsulate sidewalls of the second semiconductor die 100B.

As illustrated in FIG. 1, the redistribution circuit layer 160 may include one or more redistribution wiring layers. In some embodiments, the redistribution circuit layer 160 is electrically connected to the first semiconductor die 100A through the TIV 150. In some other embodiments, the redistribution circuit layer 160 is electrically connected to the second semiconductor die 100B through the TIV 150 and the first semiconductor die 100A. In some alternative embodiments, the redistribution circuit layer 160 is electrically connected to the second semiconductor die 100B by through semiconductor vias TSV in the second semiconductor die 100B. Furthermore, the electrical terminals 170 may include solder bumps, solder balls, solder pillars or other suitable conductors.

The SoIC chip 100 illustrated in FIG. 1 may serve as a flip-chip and may be mounted on a substrate (e.g., an interposer, a printed circuit board or the like) or may be packed by a series of packaging processes (e.g., integrated fan-out processes or other suitable processes). In an embodiment in which the SoIC chip 100 serves as a flip-chip, the SoIC chip 100 may be electrically connected to the substrate through the electrical terminals 170.

The process flow for fabricating the first semiconductor die 100A or the second semiconductor die 100B in the SoIC chip 100 will be described in accompany with FIGS. 2A through 2E in detail.

Figure 2A:
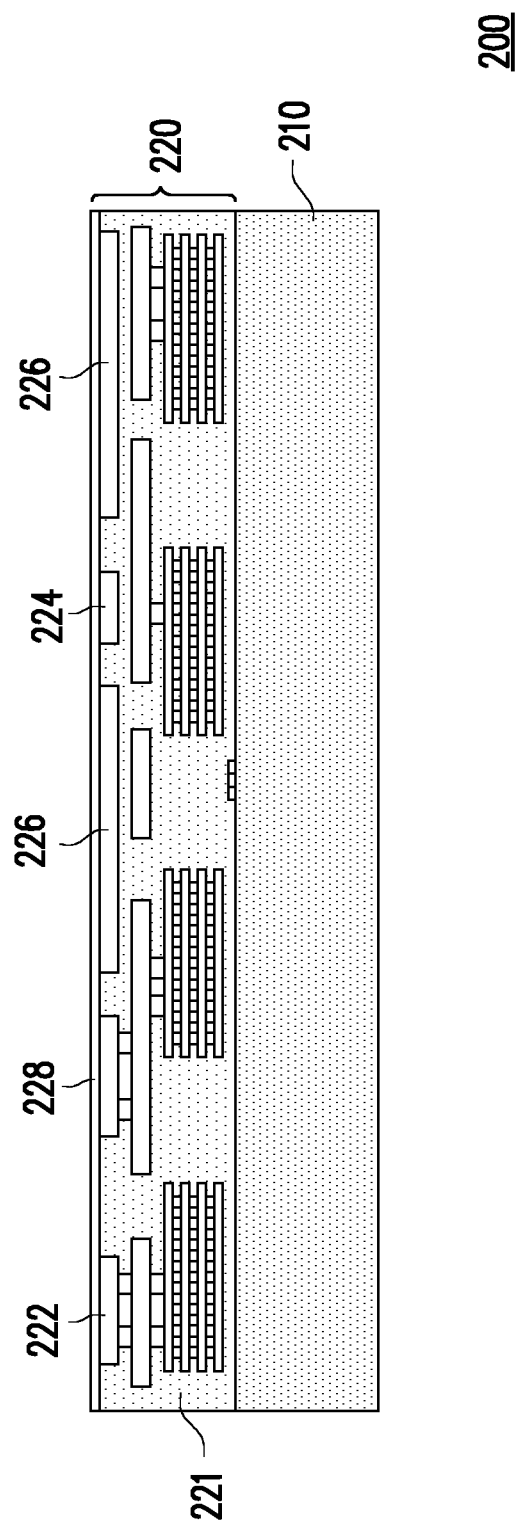
FIGS. 2A through 2E are cross-sectional views illustrating a process flow for fabricating a semiconductor die in accordance with some embodiments of the present disclosure.

Referring to FIG. 2A, a semiconductor wafer 200 including a semiconductor substrate 210 and an interconnect structure 220 over the semiconductor substrate 210 is provided. The semiconductor substrate 210 may be a bulk silicon substrate, a silicon-on-insulator (SOI) substrate or a germanium-on-insulator (GOI) substrate. The semiconductor substrate 210 may include other suitable semiconductor materials. In some embodiments, the semiconductor substrate 210 may include other conductive layers or other semiconductor elements, such as transistors, diodes, resistors, capacitors or the like.

The interconnection structure 220 is electrically connected to the conductive layers or other semiconductor elements formed in the semiconductor substrate 210. The interconnection structure 220 formed on the semiconductor substrate 210 may include dielectric layers 221, interconnect wirings 222, 224 and 226 embedded in the dielectric layers 221, and a passivation layer 228 covering the dielectric layers 221 and the interconnect wirings 222, 224 and 226. In some embodiments, the interconnect wirings may include signal transmission wirings 222, dummy wirings 224, and thermal conductors 226. The signal transmission wirings 222 are electrically connected to the conductive layers or other semiconductor elements formed in the semiconductor substrate 210 and configured to transmit signal in the interconnection structure 220. The signal transmission wirings 222 may include multiple layers of patterned wirings embedded in the dielectric layers 221.

In some embodiments, the dummy wirings 224 and the thermal conductors 226 are electrically insulated from the signal transmission wirings 222. For example, the dummy wirings 224 and the thermal conductors 226 are electrical floating. The dummy wirings 224 and the thermal conductors 226 are formed in the topmost patterned wiring of the interconnection structure 220 and are covered by the passivation layer 228. The dummy wirings 224 are formed to ensure that the semiconductor wafer 200 may have more uniform metal density. The thermal conductors 226 are configured to provide thermal paths for dissipating heat generated from the semiconductor elements (e.g., transistors, diodes, resistors, capacitors or the like) in the semiconductor substrate 210.

In some embodiments, the material of the dielectric layers 221 may include silicon oxide, silicon nitride, or the like. In some embodiments, the interconnect wirings 222, 224 and 226 may be fabricated by the same metallic material or different metallic materials, and the material of the interconnect wirings 222, 224 and 226 may include copper, or the like. In some embodiments, the material of the passivation layer 228 may include silicon oxide (e.g., TEOS formed oxide), silicon nitride, silicon oxynitride, or the like. In some embodiments, the interconnect wirings 222, 224 and 226 include barrier layers, such as Ta/TaN composited layer.

Figure 2B:
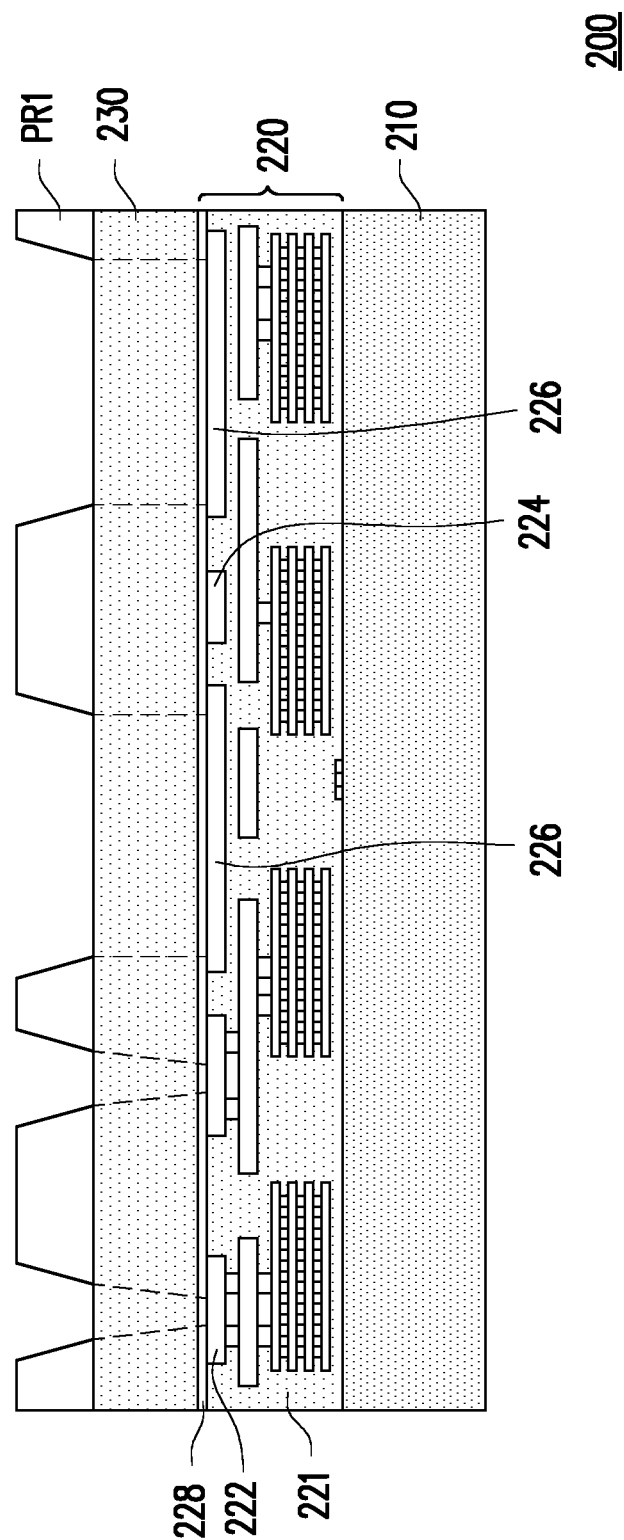

Referring to FIG. 2B, an inter-dielectric layer 230 is formed over the interconnect structure 220 of the semiconductor wafer 200. The inter-dielectric layer 230 may be formed by physical vapor deposition (PVD), chemical vapor deposition (CVD) or other suitable processes. In some embodiments, the material of the inter-dielectric layer 230 may include silicon oxide (e.g., TEOS formed oxide), silicon nitride, silicon oxynitride, or the like. A patterned photoresist layer PR1 is formed over the inter-dielectric layer 230 such that portions of the inter-dielectric layer 230 are exposed by openings of the patterned photoresist layer PR1. In some embodiments, the patterned photoresist layer PR1 is formed by a lithography process including soft baking, mask aligning, exposing, baking, developing the photoresist layer, and hard baking. In some alternative embodiments, the patterned photoresist layer PR1 is formed by electron-beam writing, ion-beam writing, mask-less lithography, molecular imprint or other suitable patterning processes.

Figure 2C:
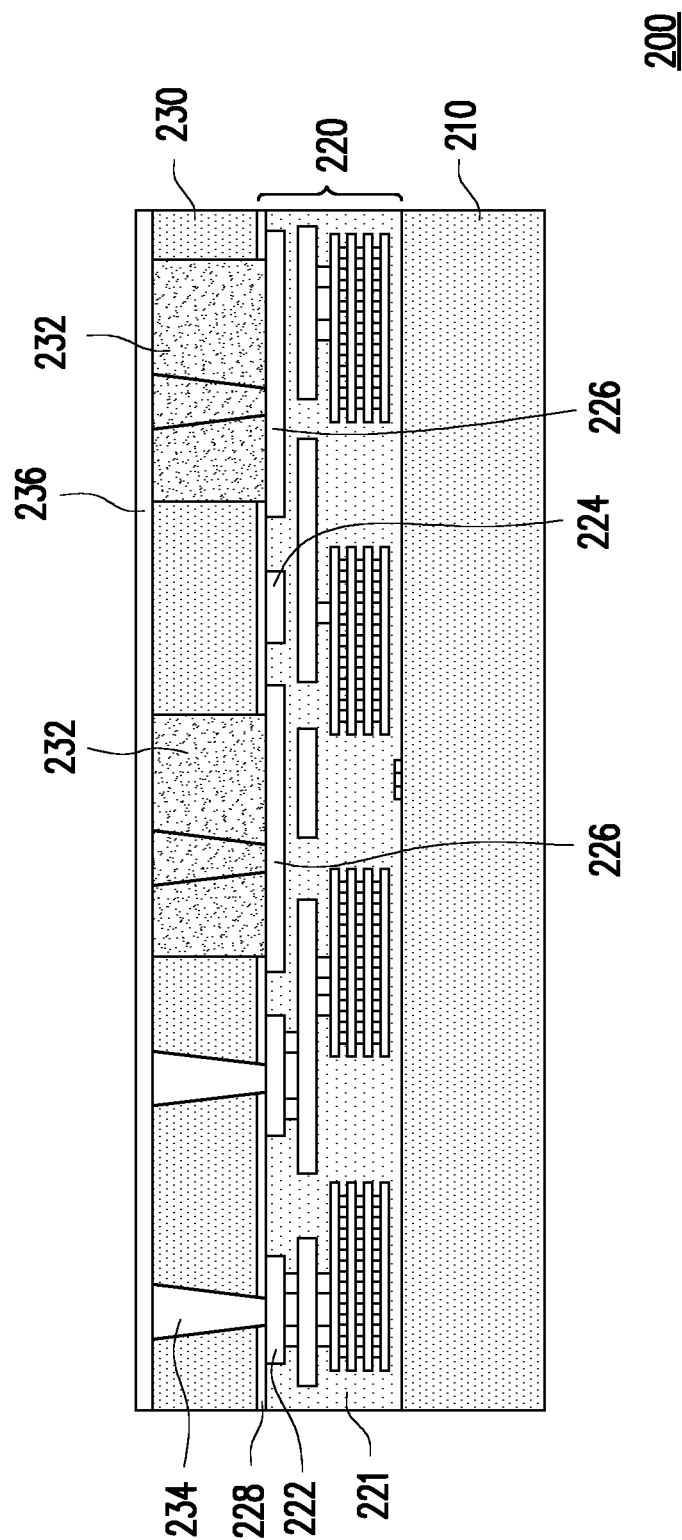

Referring to FIG. 2B and FIG. 2C, the portions of the inter-dielectric layer 230 exposed by openings of the patterned photoresist layer PR1 and portions of the passivation layer 228 under the openings of the patterned photoresist layer PR1 are removed sequentially by using the patterned photoresist layer PR1 as a mask. In some embodiments, the inter-dielectric layer 230 and the underlying passivation layer 228 are sequentially etched by dry etch or wet etch until top surfaces of the signal transmission wirings 222, the dummy wirings 224 and the thermal conductors 226 are revealed. After patterning the inter-dielectric layer 230 and the passivation layer 228, via holes for exposing the top surface of the signal transmission wirings 222 and via openings for exposing the top surface of the thermal conductors 226 are formed in the inter-dielectric layer 230. After patterning the inter-dielectric layer 230 and the passivation layer 228, the patterned photoresist layer PR1 is removed from the inter-dielectric layer 230 and metallic material is deposited over the semiconductor wafer 200 such that the metallic material may fill via holes and via openings in the inter-dielectric layer 230 and cover the top surface of the inter-dielectric layer 230. In some embodiments, the metallic material is formed by PVD (e.g., sputtering, electroplating or the like), CVD or combinations thereof.

The metallic material may be partially removed to form a thermal routing 232 in the via openings defined in the inter-dielectric layer 230 and signal transmission vias 234 in the via holes defined in the inter-dielectric layer 230. In some embodiments, a portion of the metallic material distributed outside the via openings and the via holes of the inter-dielectric layer 230 is removed until the top surface of the inter-dielectric layer 230 is exposed. For example, the portion of the metallic material distributed outside the via openings and via holes of the inter-dielectric layer 230 is by an etching process, a mechanical grinding process, a chemical mechanical polishing (CMP) process, or other suitable removal processes, or combinations thereof.

As illustrated in FIG. 2C, the thermal routing 232 is formed on the thermal conductors 226 while the signal transmission vias 234 are formed on the signal transmission wirings 222. The thermal routing 232 and the signal transmission vias 234 may be embedded in and penetrate through the inter-dielectric layer 230. Furthermore, the dummy wirings 224 are not in contact with the thermal routing 232 and the signal transmission vias 234. In some embodiments, the thermal routing 232 and the dummy wirings 224 are electrical floating.

Figure 2D:
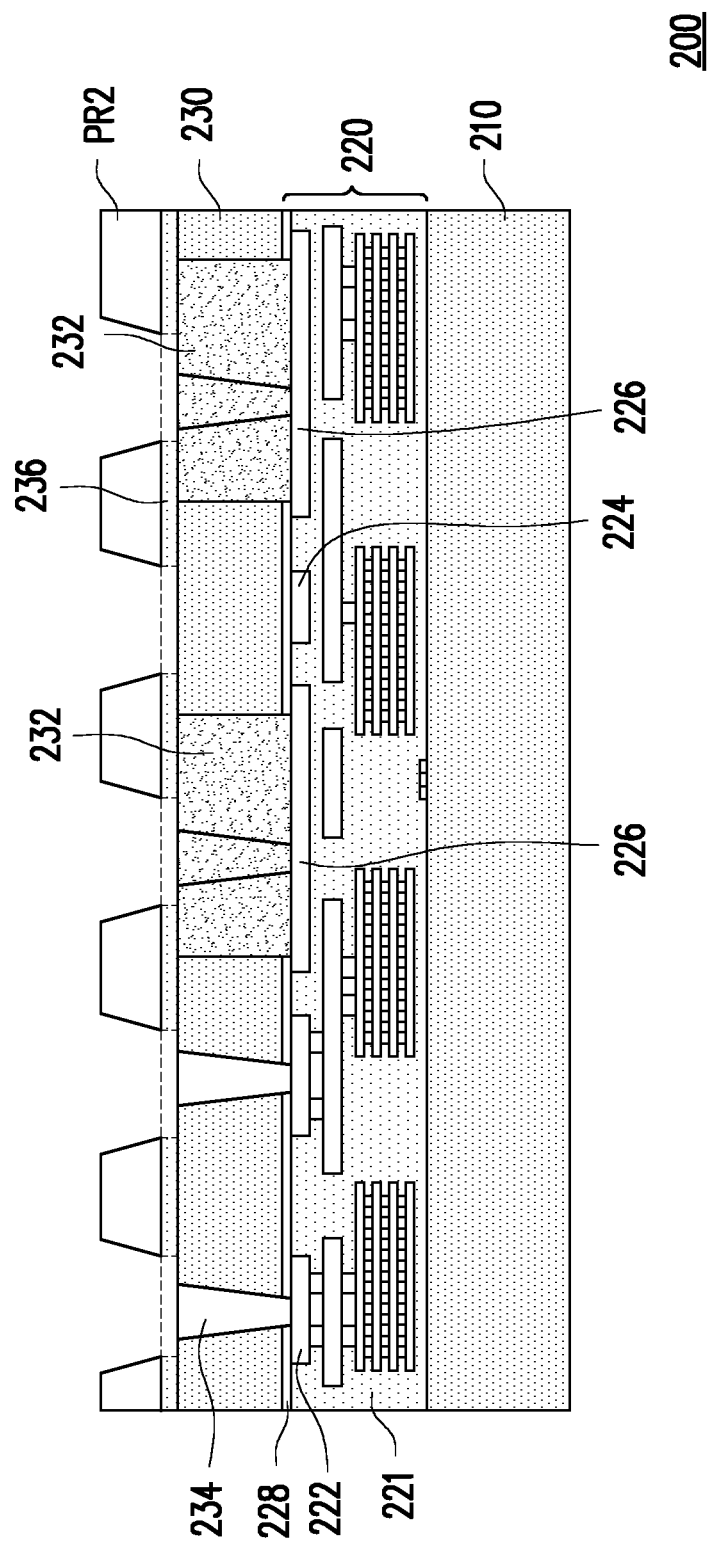

Referring to FIG. 2D, after the thermal routing 232 and the signal transmission vias 234 are formed, a bonding dielectric layer 236 is deposited over the semiconductor wafer 200 to cover top surfaces of the inter-dielectric layer 230, the thermal routing 232 and the signal transmission vias 234. The bonding dielectric layer 236 may be formed by PVD, CVD or other suitable deposition processes. In some embodiments, the material of the bonding dielectric layer 236 may include silicon oxide (e.g., TEOS formed oxide), silicon nitride, silicon oxynitride, or the like. A patterned photoresist layer PR2 is formed over the bonding dielectric layer 236 such that portions of the bonding dielectric layer 236 are exposed by openings of the patterned photoresist layer PR2. In some embodiments, the patterned photoresist layer PR2 is formed by a lithography process including soft baking, mask aligning, exposing, baking, developing the photoresist layer, and hard baking. In some alternative embodiments, the patterned photoresist layer PR2 is formed by electron-beam writing, ion-beam writing, mask-less lithography, molecular imprint or other suitable patterning processes.

Figure 2E:
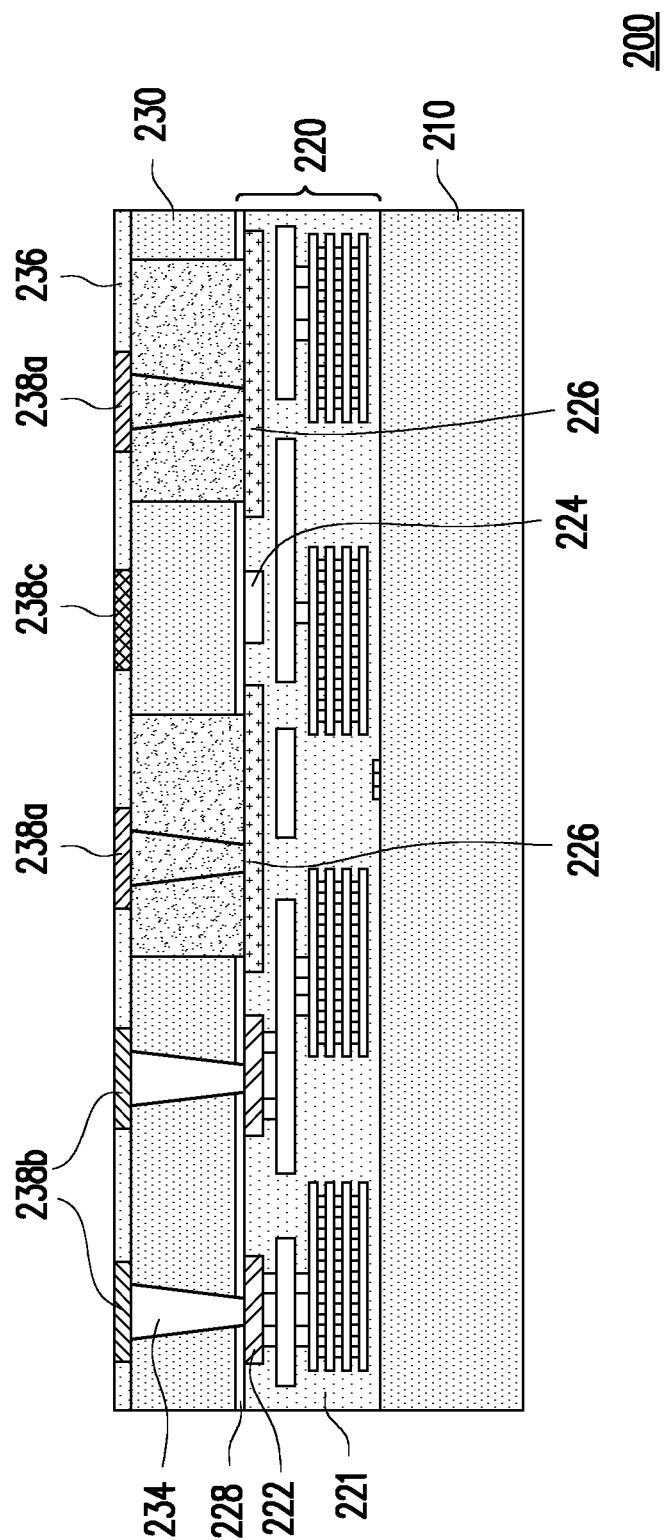

Referring to FIG. 2D and FIG. 2E, the portions of the bonding dielectric layer 236 exposed by openings of the patterned photoresist layer PR2 are removed by using the patterned photoresist layer PR2 as a mask. In some embodiments, the bonding dielectric layer 236 is etched by dry etch or wet etch until top surfaces of the inter-dielectric layer 230, the thermal routing 232 and the signal transmission vias 234 are revealed. After patterning the bonding dielectric layer 236, pad openings for exposing the inter-dielectric layer 230, the top surfaces of the thermal routing 232 and the signal transmission vias 234 are formed in the bonding dielectric layer 236. After patterning the bonding dielectric layer 236, the patterned photoresist layer PR2 is removed from the bonding dielectric layer 236 and metallic material is then deposited over the semiconductor wafer 200 such that the metallic material may fill pad openings in the bonding dielectric layer 236 and cover the top surface of the bonding dielectric layer 236. In some embodiments, the metallic material is formed by PVD (e.g., sputtering, electroplating or the like), CVD or combinations thereof.

The metallic material may be partially removed to form thermal pads 238a, bonding pads 238b and dummy pads 238c in the pad openings defined in the bonding dielectric layer 236. In some embodiments, a portion of the metallic material distributed outside the pad openings of the bonding dielectric layer 236 is removed until the top surface of the bonding dielectric layer 236 is exposed. For example, the portion of the metallic material distributed outside the pad openings of the bonding dielectric layer 236 is by an etching process, a mechanical grinding process, a chemical mechanical polishing (CMP) process, or other suitable removal processes, or combinations thereof.

In some embodiments, a wafer singulation process may be performed to singulate the semiconductor wafer 200 illustrated in FIG. 2E to obtain singulated semiconductor dies.

The thermal pads 238a are formed on and in contact with the thermal routing 232, the bonding pads 238b are formed on the in contact with the signal transmission vias 234, and the dummy pads 238c are formed on the inter-dielectric layer 230. The thermal pads 238a, the bonding pads 238b and the dummy pads 238c may be embedded in and penetrate through the bonding dielectric layer 236. In some embodiments, the dummy pads 238c are not in contact with the thermal pads 238a and the bonding pads 238b. The dummy pads 238c may be electrically insulated from the thermal pads 238a, the bonding pads 238b, thermal routing 232 and the signal transmission vias 234. Furthermore, dummy pads 238c may be spaced apart from the dummy wirings 224 by the inter-dielectric layer 230. For example, the thermal pads 238a and the dummy pads 238c are electrical floating.

As illustrated FIG. 2E, the semiconductor wafer 200 includes a bonding structure which includes a dielectric layer covering the interconnect structure 220, signal transmission features penetrating through the dielectric layer, and a thermal conductive feature penetrating through the dielectric layer. In some embodiments, the dielectric layer of the bonding structure includes the inter-dielectric layer 230 and the bonding dielectric layer 236, the signal transmission features include the signal transmission vias 234 and the bonding pads 238b, and the thermal conductive feature includes the thermal routing 232 and the thermal pads 238a. Furthermore, the thermal pads 238a are disposed on and share the thermal routing 232.

Figure 3:
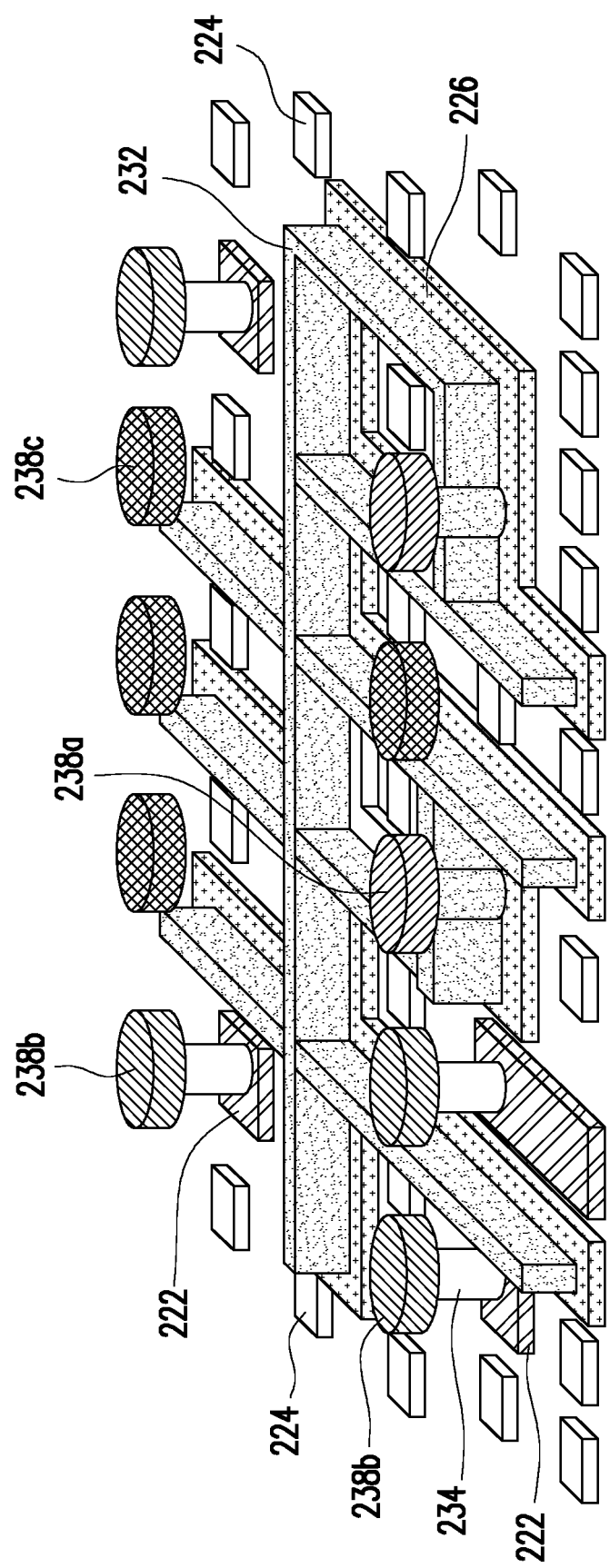
FIG. 3 is a perspective view illustrating the bonding structure illustrated in FIG. 2E.

FIG. 3 is a perspective view illustrating the bonding structure of the semiconductor wafer 200 illustrated in FIG. 2E.

Referring to FIG. 2E and FIG. 3, the signal transmission wirings 222, the dummy wirings 224 and the thermal conductor 226 are arranged at a level height in the semiconductor wafer 200, while the thermal pads 238a, the bonding pads 238b and the dummy pads 238c are arranged at another level height in the semiconductor wafer 200. In some embodiments, the dummy wirings 224 includes dummy dot patterns arranged regularly or irregularly. The thermal pads 238a, the bonding pads 238b and the dummy pads 238c embedded in the bonding dielectric layer 236 may be arranged in array. The thermal pads 238a are thermally coupled to the thermal conductor 226 through the thermal routing 232, and the bonding pads 238b are electrically connected to the signal transmission wirings 222 through the signal transmission vias 234. In some embodiments, the thermal routing 232 is landed on the top surface of the thermal conductor 226, the thermal conductor 226 may be wider than the thermal routing 232, and the pattern of the thermal conductor 226 may be similar with the pattern of the thermal routing 232. In some embodiments, the thermal routing 232 may include via portions and wall portions laterally connecting via portions, wherein the via portions are located under and in contact with the thermal pads 238a. The via portions of the thermal routing 232 may be cylindrical pillars, and the wall portions of the thermal routing 232 and the thermal conductor 226 may extend under at least two or all of the thermal pads 238a along a meandering path. In some other embodiments, the thermal routing 232 may be a meshed thermal routing, and the thermal conductor 226 may be a meshed thermal conductor.

Figure 4A:
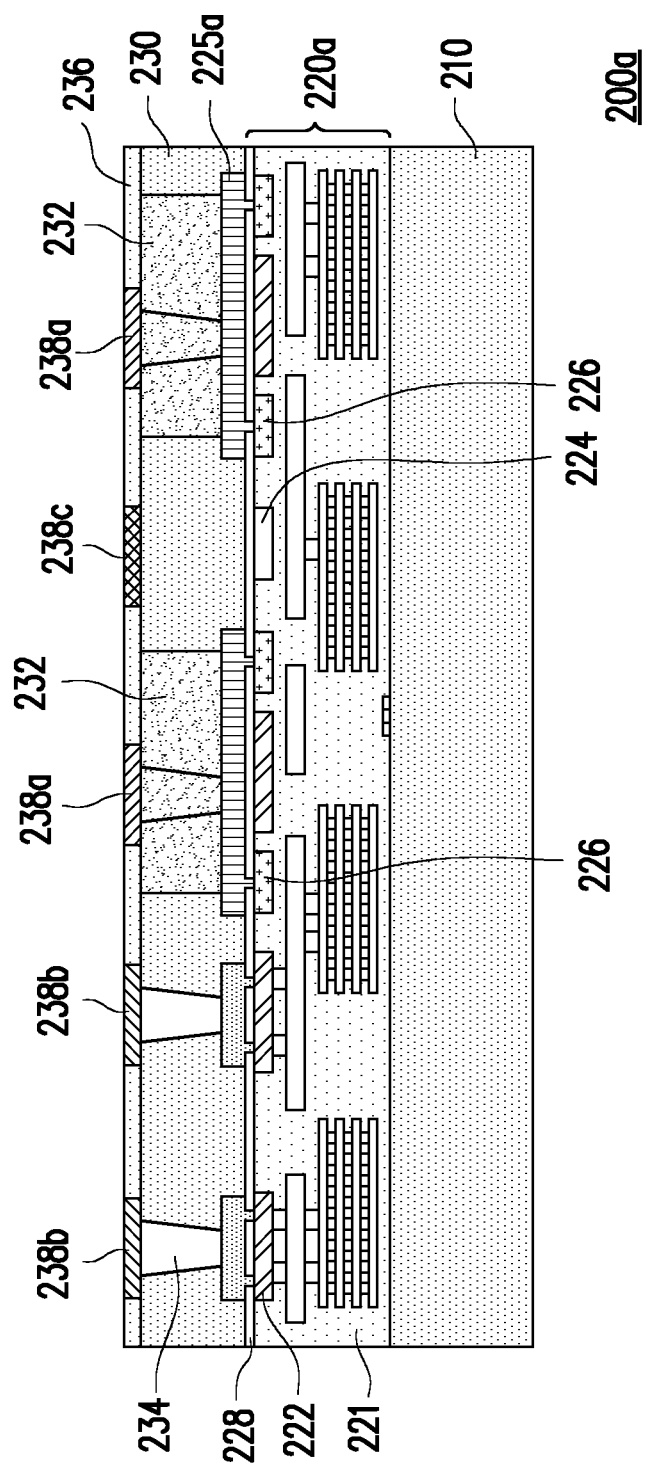
FIG. 4A is a cross-sectional view illustrating a semiconductor die in accordance with other embodiments of the present disclosure.
Figure 4B:
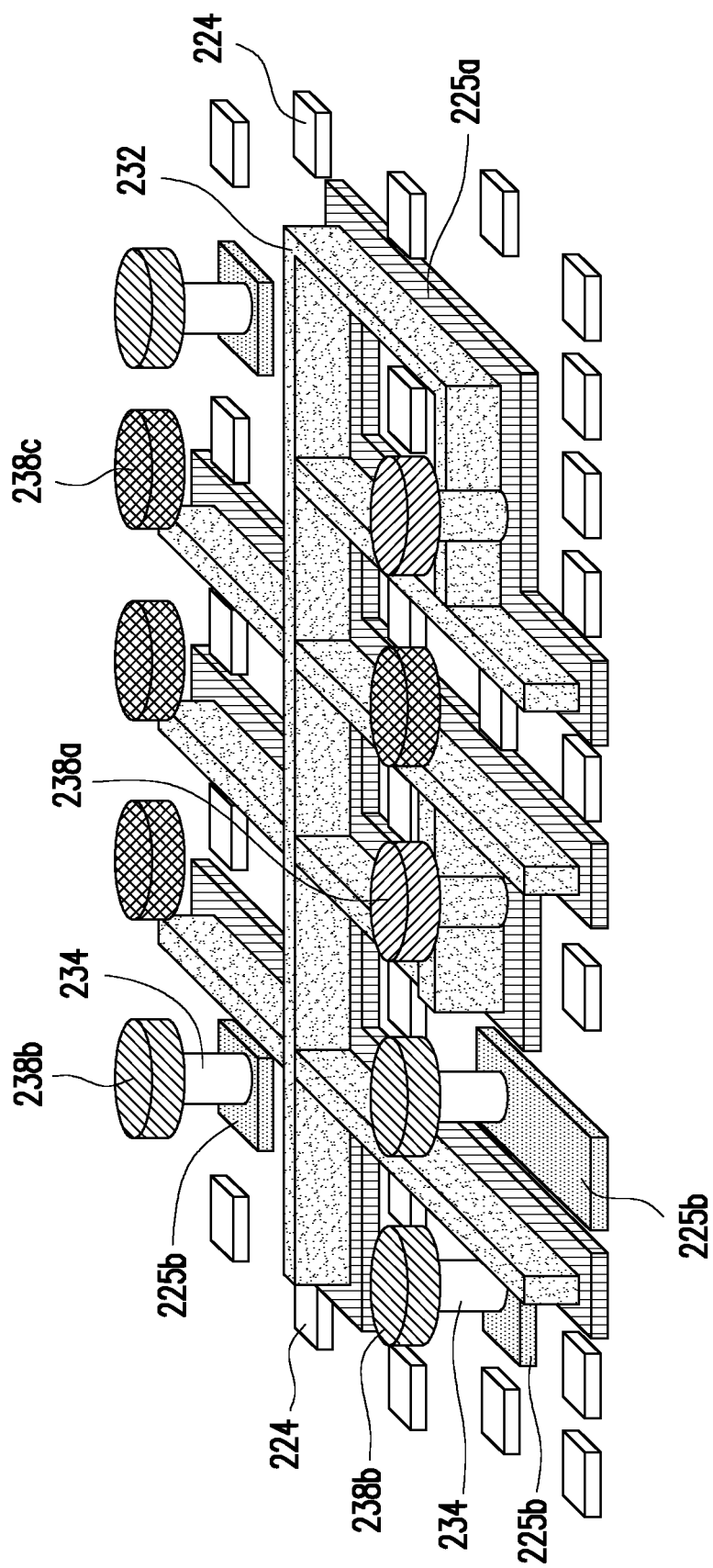
FIG. 4B is a perspective view illustrating the bonding structure illustrated in FIG. 4A.

FIG. 4A is a cross-sectional view illustrating a semiconductor die in accordance with other embodiments of the present disclosure. FIG. 4B is a perspective view illustrating the bonding structure illustrated in FIG. 4A.

Referring to FIG. 2E, FIG. 3, FIG. 4A and FIG. 4B, the semiconductor wafer 200a illustrated in FIG. 4A and FIG. 4B is similar with the semiconductor wafer 200 illustrated in FIG. 2E and FIG. 3 except that the interconnect structure 220a further includes thermal conductors 225a and interconnect wirings 225b. The thermal conductors 225a are disposed over the passivation layer 228 and thermally coupled to the thermal conductor 226, and the interconnect wirings 225b are disposed over the passivation layer 228 and electrically connected to the signal transmission wirings 222. Furthermore, portions of the signal transmission wirings 222 may be covered by the thermal conductors 225a, and the thermal conductors 225a is spaced apart from the underlying signal transmission wirings 222 by the passivation layer 228.

In some embodiments, the thermal conductors 225a and the interconnect wirings 225b are embedded in the inter-dielectric layer 230, the thermal routing 232 are landed on the thermal conductors 225a, and the signal transmission vias 234 are landed on the interconnect wirings 225b. In some embodiments, the thermal routing 232 is landed on the top surface of the thermal conductor 225a, the thermal conductor 225a may be wider than the thermal routing 232, and the pattern of the thermal conductor 225a may be similar with the pattern of the thermal routing 232.

In some embodiments, the thermal routing 232 may include via portions and wall portions laterally connecting via portions, wherein the via portions are located under and in contact with the thermal pads 238a. The via portions of the thermal routing 232 may be cylindrical pillars, and the wall portions of the thermal routing 232 and the thermal conductor 225a may extend under at least two or all of the thermal pads 238a along a meandering path. In some other embodiments, the thermal routing 232 may be a meshed thermal routing, and the thermal conductor 225a may be a meshed thermal conductor. In some embodiments, the thermal conductor 225a and the interconnect wirings 225b include aluminum pads formed over the passivation layer 228. In some other embodiments, the material of the thermal conductor 225a and the interconnect wirings 225b includes copper, aluminum, Al—Cu alloy, or the like.

Figure 5A:
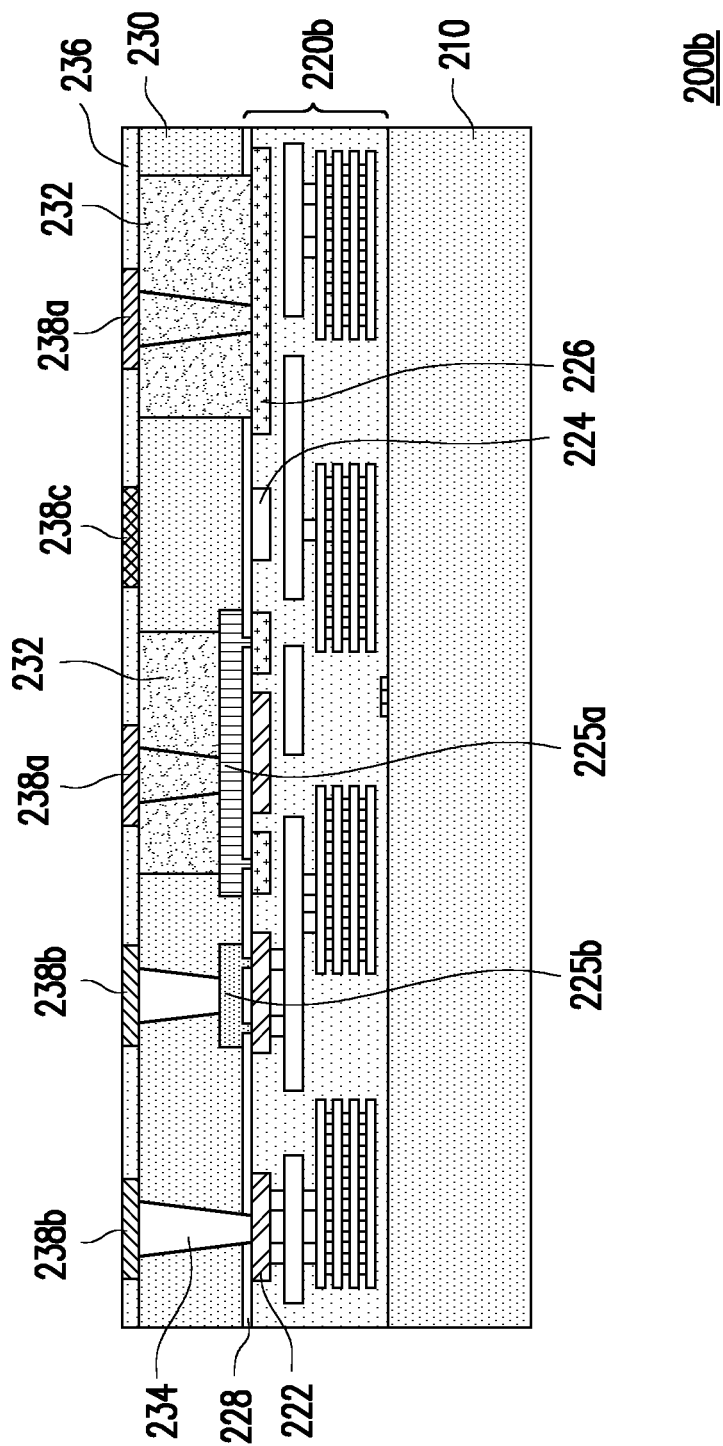
FIG. 5A is a cross-sectional view illustrating a semiconductor die in accordance with some alternative embodiments of the present disclosure.
Figure 5B:
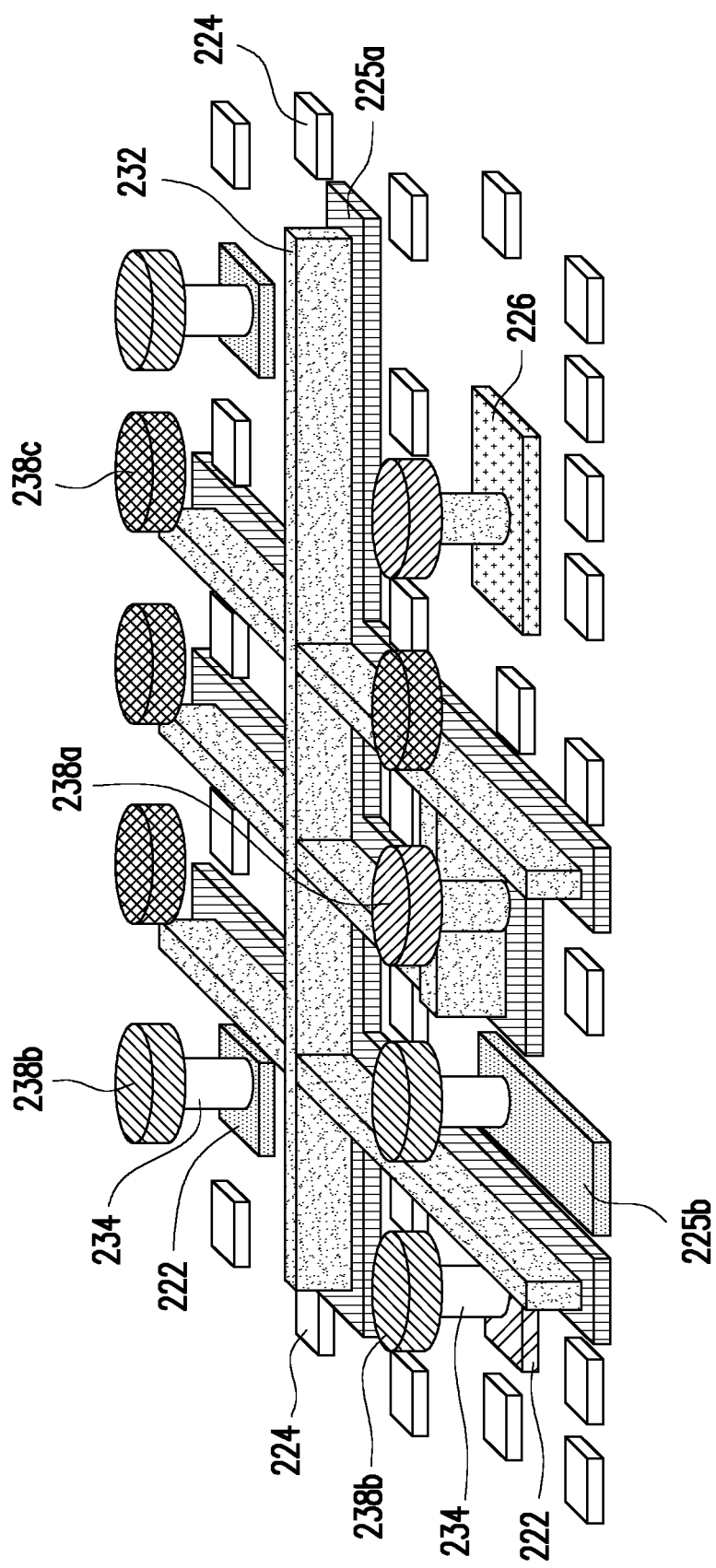
FIG. 5B is a perspective view illustrating the bonding structure illustrated in FIG. 5A.

FIG. 5A is a cross-sectional view illustrating a semiconductor die in accordance with some alternative embodiments of the present disclosure. FIG. 5B is a perspective view illustrating the bonding structure illustrated in FIG. 5A.

Referring to FIG. 4A, FIG. 4B, FIG. 5A and FIG. 5B, the semiconductor wafer 200b illustrated in FIG. 5A and FIG.

5B is similar with the semiconductor wafer 200a illustrated in FIG. 4A and FIG. 4B except a portion of the thermal routing 232 is landed on the thermal conductors 225a, another portion of the thermal routing 232 is landed on the thermal conductors 226, some of the signal transmission vias 234 are landed on the interconnect wirings 225b, and the rest of the signal transmission vias 234 are landed on the interconnect wirings 222.

The process flow for fabricating the SoIC chip 100 illustrated in FIG. 1 is described in accompany with FIGS. 6A through 6D in detail.

Figure 6A:
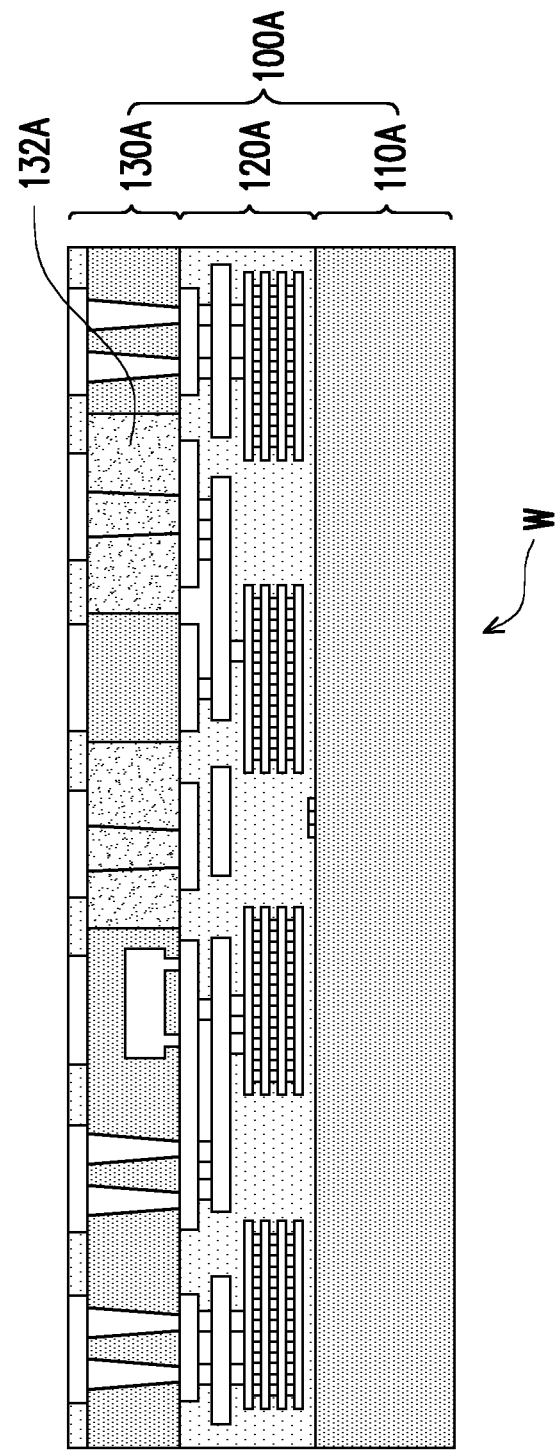
FIGS. 6A through 6D are cross-sectional views illustrating a process flow for fabricating the SoIC chip illustrated in FIG. 1 in accordance with some embodiments of the present disclosure.

Referring to FIG. 6A, a semiconductor wafer W including a plurality of first semiconductor dies 100A arranged therein is provided, wherein each first semiconductor die 100A in the semiconductor wafer W may include the first semiconductor substrate 110A, the first interconnect structure 120A disposed over the first semiconductor substrate 110A, and the first bonding structure 130A disposed over the first interconnect structure 120A. Furthermore, the first bonding structure 130A includes at least one first thermal conductive feature 132A embedded therein. In some embodiments, the semiconductor wafer W illustrated in FIG. 6A may be the same as the semiconductor wafer 200 illustrated in FIG. 2E and may be fabricated by the processes illustrated in FIGS. 2A through 2E. In some alternative embodiments, the semiconductor wafer W illustrated in FIG. 6A may be the same as the semiconductor wafer 200a illustrated in FIG. 4A or the semiconductor wafer 200b illustrated in FIG. 5A.

Figure 6B:
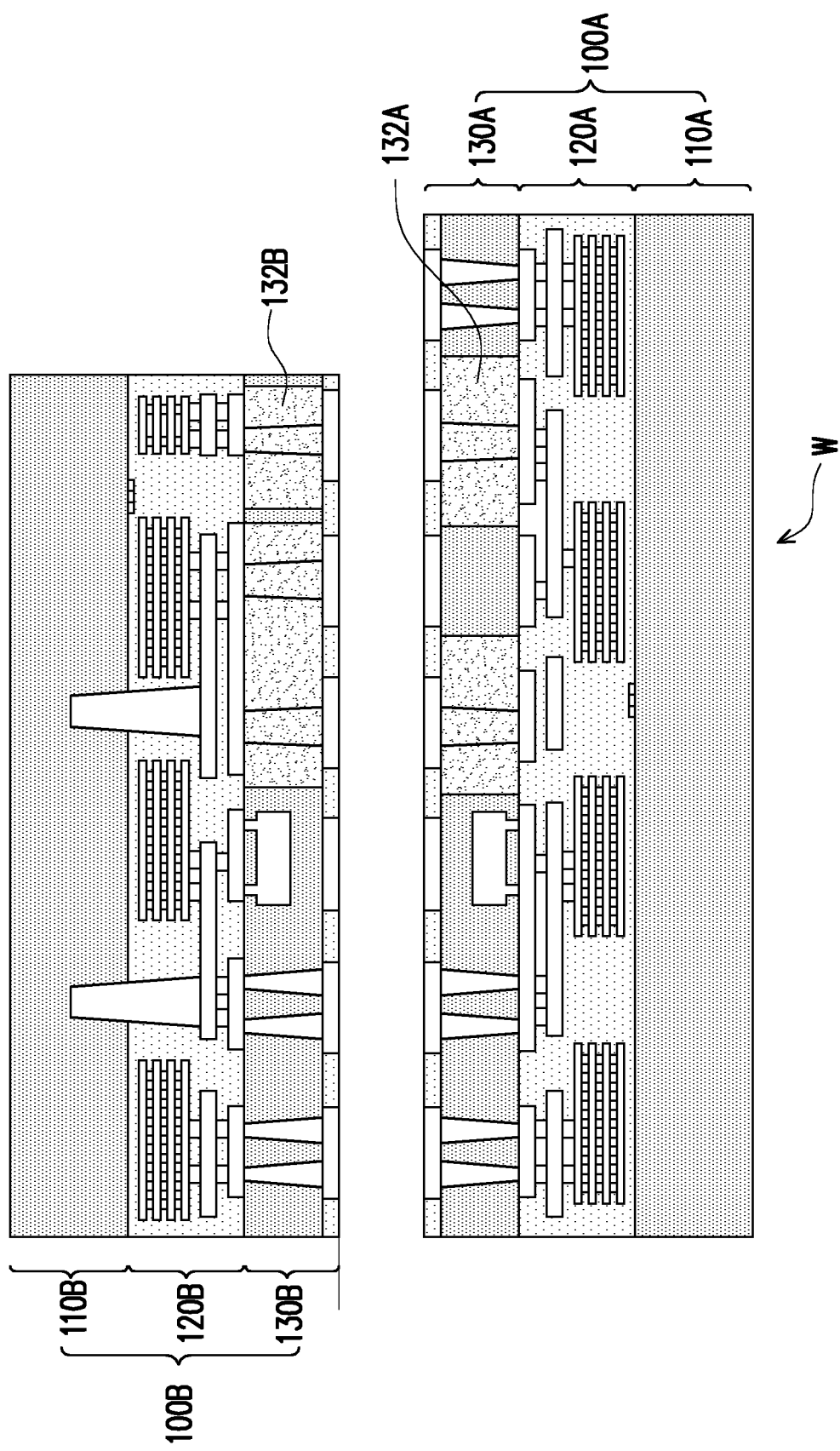
Figure 6C:
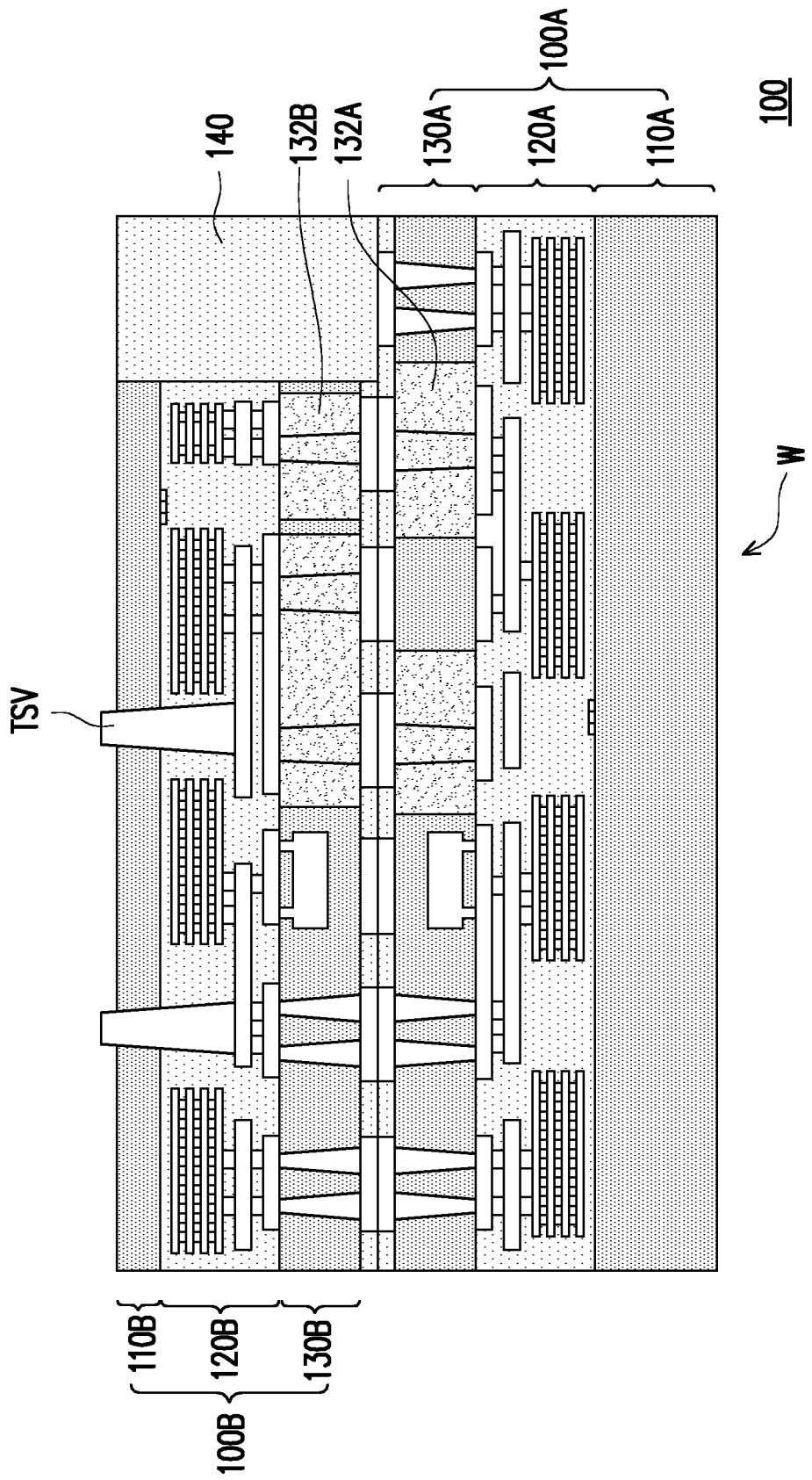

Referring to FIG. 6B and FIG. 6C, at least one second semiconductor die 100B is provided and mounted onto the semiconductor wafer W. The second semiconductor die 100B may include the second semiconductor substrate 110B, the second interconnect structure 120B disposed over the second semiconductor substrate 110B, and the second bonding structure 130B disposed over the second interconnect structure 120B. Furthermore, the second bonding structure 130B includes at least one second thermal conductive feature 132B embedded therein. In some embodiments, the second semiconductor die 100B is bonded with the semiconductor wafer W through a chip-to-wafer bonding process. For example, the second bonding structure 130B of the second semiconductor die 100B is bonded with the first bonding structure 130A of the semiconductor wafer W through a hybrid bonding process or other suitable bonding processes.

In some embodiments, the second semiconductor die 100B may be a singulated semiconductor die fabricated from the semiconductor wafer 200 illustrated in FIG. 2E. In some other embodiments, the second semiconductor die 100B may be a singulated semiconductor die fabricated from the semiconductor wafer 200a illustrated in FIG. 4A or fabricated from the semiconductor wafer 200b illustrated in FIG. 5A.

As illustrated in FIG. 6C, after the second semiconductor die 100B and the semiconductor wafer W are bonded, an insulating encapsulant 140 is formed over the semiconductor wafer W to laterally encapsulate the second semiconductor die 100B. In some embodiments, the insulating encapsulant 140 may formed an over molding process followed by a grinding process. For instance, a molding compound is formed over the semiconductor wafer W to cover the second semiconductor die 100B, and the molding compound is then ground through a CMP process such that the insulating encapsulant 140 can be formed by over the semiconductor wafer W. After performing the CMP process, the second semiconductor substrate 110B of the second semiconductor die 100B are polished as well such that through semiconductor vias TSV are revealed at the rear surface of the second semiconductor substrate 110B. In some embodiments, the through semiconductor vias TSV protrude from the rear surface of the second semiconductor substrate 110B. In some other embodiments, not illustrated in FIG. 6C, the through semiconductor vias TSV may not protrude from the rear surface of the second semiconductor substrate 110B, and exposed surfaces of the through semiconductor vias TSV may be substantially level with the rear surface of the second semiconductor substrate 110B.

In some other embodiments, the insulating encapsulant 140 may be formed by other materials and other fabrication processes. For example, the insulating encapsulant 140 is a single layered or multiple layered oxide layer, a single layered or multiple layered nitride layer or other suitable insulating materials, and the insulating encapsulant 140 is formed through a CVD process or other suitable processes.

Figure 6D:
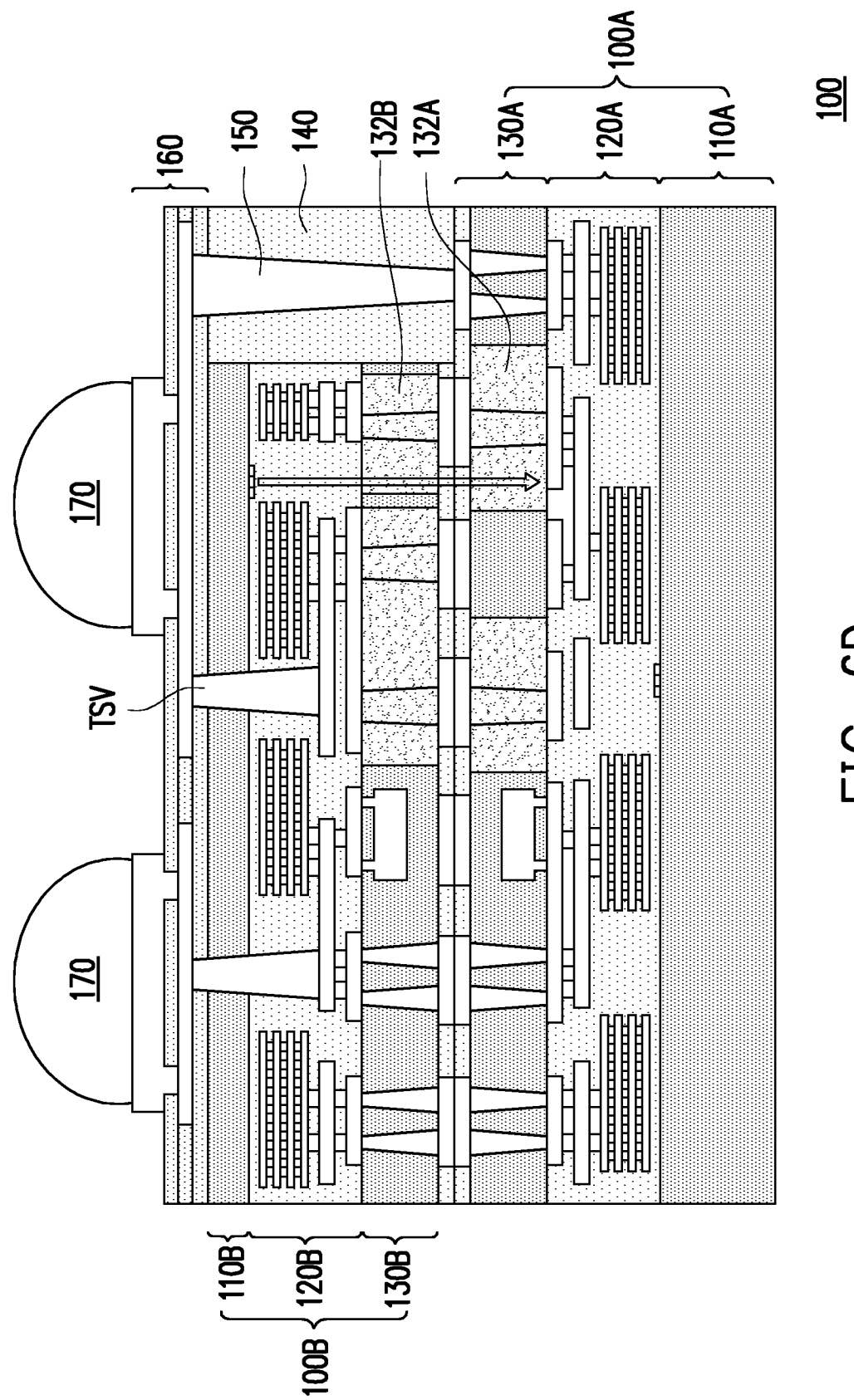

Referring to FIG. 6D, at least one TIV 150 penetrating through the insulating encapsulant 140 and electrically connected to the semiconductor wafer W is formed. Then, redistribution circuit layer 160 and electrical terminals 170 are formed over the second semiconductor die 100B and the insulating encapsulant 140. After the redistribution circuit layer 160 and electrical terminals 170 are formed, the wafer level package including the semiconductor wafer W, the second semiconductor die 100B, the insulating encapsulant 140, the TIV 150, the redistribution circuit layer 160 and the electrical terminals 170 are subjected to a wafer singulation process to as to obtain multiple singulated SoIC chips 100. The detailed structure of the singulated SoIC chip 100 has been described in accompany with FIG. 1.

In the above-mentioned embodiments of the present invention, multiple thermal conductive features are formed in bonding structures of the SoIC chip to increase metal ratio of the bonding structures and enhance heat transfer performance of the SoIC chip. Accordingly, the SoIC chip may have improved heat dissipation performance.

In accordance with some embodiments of the disclosure, a semiconductor structure including a semiconductor substrate, an interconnect structure disposed over the semiconductor substrate, and a bonding structure disposed over the interconnect structure is provided. The bonding structure includes a dielectric layer covering the interconnect structure, signal transmission features penetrating through the dielectric layer, and a thermal conductive feature penetrating through the dielectric layer. The thermal conductive feature includes a thermal routing and thermal pads, and the thermal pads are disposed on and share the thermal routing.

In accordance with some embodiments of the disclosure, a semiconductor structure including a first semiconductor die, a second semiconductor die, and an insulating encapsulant is provided. The first semiconductor die includes a first bonding structure, the first bonding structure including a first dielectric layer, first signal transmission features penetrating through the first dielectric layer, and a first thermal conductive feature penetrating through the first dielectric layer. The first thermal conductive feature includes a first thermal routing and first thermal pads, and the first thermal pads are disposed on and share the first thermal routing. The second semiconductor die includes a second bonding structure, the second bonding structure including a second dielectric layer, second signal transmission features penetrating through the second dielectric layer, and a second thermal conductive feature penetrating through the second dielectric layer. The second thermal conductive feature includes a second thermal routing and second thermal pads, and the second thermal pads are disposed on and share the second thermal routing. The insulating encapsulant is disposed on the second semiconductor die and encapsulates the first semiconductor die. The first dielectric layer is bonded to the second dielectric layer, the first signal transmission features are bonded and electrically connected to the second signal transmission features, and the first thermal pads are bonded and thermally coupled to the second thermal pads.

In accordance with some embodiments of the disclosure, a method including the followings is provided. A semiconductor substrate having an interconnect structure disposed thereon is provided. An inter-dielectric layer is formed over the interconnect structure. Multiple vias and a thermal routing are formed in the inter-dielectric layer. A bonding dielectric layer is formed over the inter-dielectric layer. Multiple bonding pads and thermal pads are formed in the bonding dielectric layer, wherein the bonding pads are formed on the vias, and the thermal pads are formed on the and share the thermal routing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   an interconnect structure disposed over the semiconductor substrate; and
   a bonding structure disposed over the interconnect structure, the bonding structure comprising a dielectric layer covering the interconnect structure, signal transmission features penetrating through the dielectric layer, and a thermal conductive feature penetrating through the dielectric layer, wherein the thermal conductive feature comprises a thermal routing and thermal pads, the thermal pads are disposed on and share the thermal routing, and the thermal routing laterally extends between at least two neighboring signal transmission features among the signal transmission features,
   wherein the interconnect structure comprises interconnect wirings, a passivation layer covering the interconnect wirings and a first thermal conductor partially covered by the passivation layer, and a first portion of the thermal routing is landed on the first thermal conductor.

2. The semiconductor structure as claimed in claim 1, wherein the dielectric layer comprises a bonding dielectric layer and an inter-dielectric layer disposed between the bonding dielectric layer and the interconnect structure.

3. The semiconductor structure as claimed in claim 2, wherein each signal transmission feature among the signal transmission features comprises a via penetrating through the inter-dielectric layer and a bonding pad penetrating through the bonding dielectric layer, and the bonding pad is electrically connected to the interconnect structure through the via.

4. The semiconductor structure as claimed in claim 2, wherein the thermal routing penetrates through the inter-dielectric layer, and the thermal pads penetrate through the bonding dielectric layer.

5. The semiconductor structure as claimed in claim 2, wherein the bonding structure further comprises dummy pads embedded in the bonding dielectric layer, and the dummy pads are electrically insulated from the interconnect structure by the inter-dielectric layer.

6. The semiconductor structure as claimed in claim 1, wherein the thermal routing laterally extends along a meandering path.

7. The semiconductor structure as claimed in claim 1, wherein the thermal routing comprises via portions and wall portions laterally connecting via portions, and the via portions are in contact with the thermal pads, and wherein at least one of the wall portions laterally extend between at least two neighboring signal transmission features among the signal transmission features.

8. The semiconductor structure as claimed in claim 1, wherein the thermal conductive feature is electrically insulated from the signal transmission features.

9. The semiconductor structure as claimed in claim 1, wherein the thermal conductive feature is electrical floating.

10. The semiconductor structure as claimed in claim 1, wherein the interconnect structure further comprises a second thermal conductor disposed over the passivation layer, and a second portion of the thermal routing is landed on the second thermal conductor.

11. A semiconductor structure, comprising:
    a first semiconductor die comprising an interconnect structure and a first bonding structure, the interconnect structure comprising interconnect wirings, a passivation layer covering the interconnect wirings and a thermal conductor partially covered by the passivation layer, and the thermal routing being landed on the thermal conductor, the first bonding structure comprising a first dielectric layer, first signal transmission features penetrating through the first dielectric layer, and a first thermal conductive feature penetrating through the first dielectric layer, wherein the first thermal conductive feature comprises a first thermal routing and first thermal pads, the first thermal pads are disposed on and share the first thermal routing, and the first thermal routing laterally extends between at least two neighboring first signal transmission features among the first signal transmission features; and
    a second semiconductor die comprising a second bonding structure, the second bonding structure comprising a second dielectric layer, second signal transmission features penetrating through the second dielectric layer, and a second thermal conductive feature penetrating through the second dielectric layer, wherein the second thermal conductive feature comprises a second thermal routing and second thermal pads, and the second thermal pads are disposed on and share the second thermal routing; and
    an insulating encapsulant disposed on the second semiconductor die and encapsulating the first semiconductor die,
    wherein the first dielectric layer is bonded to the second dielectric layer, the first signal transmission features are bonded and electrically connected to the second signal transmission features, and the first thermal pads are bonded and thermally coupled to the second thermal pads.

12. The semiconductor structure as claimed in claim 11, wherein the first thermal routing comprises a meshed thermal routing.

13. The semiconductor structure as claimed in claim 11, wherein the first thermal conductive feature and the second thermal conductive feature are electrical floating, and the first thermal conductive feature and the second thermal conductive feature are electrically insulated from the first signal transmission features and the second signal transmission features.

14. The semiconductor structure as claimed in claim 11, wherein the first bonding structure further comprises first dummy pads embedded in the first dielectric layer, the second bonding structure further comprises second dummy pads embedded in the second dielectric layer, the first dummy pads and the second dummy pads are bonded.

15. The semiconductor structure as claimed in claim 11, wherein the first thermal routing comprises first via portions and first wall portions laterally connecting first via portions, and the first via portions are in contact with the first thermal pads, and wherein at least one of the first wall portions laterally extend between at least two neighboring first signal transmission features among the first signal transmission features.

16. The semiconductor structure as claimed in claim 11, wherein the second thermal routing comprises second via portions and second wall portions laterally connecting second via portions, and the second via portions are in contact with the second thermal pads, and wherein at least one of the second wall portions laterally extend between at least two neighboring second signal transmission features among the second signal transmission features.

17. A method, comprising:
providing a semiconductor substrate having an interconnect structure disposed thereon, wherein the interconnect structure comprises interconnect wirings, a passivation layer covering the interconnect wirings and a thermal conductor partially covered by the passivation layer, and the thermal routing is landed on the thermal conductor; and forming an inter-dielectric layer over the interconnect structure;

forming vias and a thermal routing in the inter-dielectric layer;

forming a bonding dielectric layer over the inter-dielectric layer; and forming bonding pads and thermal pads in the bonding dielectric layer, wherein the bonding pads are formed on the vias, the thermal pads are formed on the and share the thermal routing, and the thermal routing laterally extends between at least two neighboring signal transmission features among the signal transmission features.

18. The method as claimed in claim 17, wherein dummy pads are in the bonding dielectric layer when forming the bonding pads and the thermal pads in the bonding dielectric layer, and the dummy pads are electrically insulated from the interconnect structure by the inter-dielectric layer.

19. The method as claimed in claim 17, wherein the thermal routing is formed on a thermal conductor partially covered by a passivation layer of the interconnect structure.

20. The method as claimed in claim 17, wherein the thermal routing is formed on a thermal conductor disposed over a passivation layer of the interconnect structure, and the thermal conductor is embedded in the inter-dielectric layer.

* * * * *